(12) United States Patent
Guevara et al.

(10) Patent No.: US 12,205,871 B2
(45) Date of Patent: *Jan. 21, 2025

(54) CONDUCTIVE MEMBER CAVITIES

(71) Applicant: Texas Instruments Incorporated, Dallas, TX (US)

(72) Inventors: Rafael Jose Lizares Guevara, Metro Manila (PH); Jovenic Romero Esquejo, Baguio (PH); Arvin Cedric Quiambao Mallari, San Fernando (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,673

(22) Filed: May 26, 2023

(65) Prior Publication Data

US 2023/0307327 A1 Sep. 28, 2023

Related U.S. Application Data

(63) Continuation of application No. 17/219,768, filed on Mar. 31, 2021, now Pat. No. 11,699,639.

(51) Int. Cl.
*H01L 23/495* (2006.01)
*H01L 23/00* (2006.01)

(52) U.S. Cl.
CPC .......... *H01L 23/4952* (2013.01); *H01L 24/11* (2013.01); *H01L 24/13* (2013.01); *H01L 24/81* (2013.01); *H01L 2224/11552* (2013.01); *H01L 2224/13011* (2013.01); *H01L 2224/13564* (2013.01); *H01L 2224/81815* (2013.01)

(58) Field of Classification Search
CPC ..... H01L 23/4952; H01L 24/11; H01L 24/13; H01L 24/81; H01L 2224/11552; H01L 2224/13011; H01L 2224/13564; H01L 2224/81815; H01L 24/16; H01L 2224/10145; H01L 2224/11334; H01L 2224/13013; H01L 2224/13014; H01L 2224/13019; H01L 2224/13076; H01L 2224/13082; H01L 2224/16058; H01L 2224/16245; H01L 24/00; H01L 23/49541
See application file for complete search history.

(56) References Cited

U.S. PATENT DOCUMENTS

| | | | |
|---|---|---|---|
| 9,859,241 B1 * | 1/2018 | Aoki | ........................ H01L 24/11 |
| 10,756,041 B1 | 8/2020 | Arvin et al. | |
| 11,264,527 B2 | 3/2022 | Boone et al. | |
| 11,699,639 B2 * | 7/2023 | Guevara | .............. H01L 23/4952 |
| | | | 257/666 |
| 2014/0027900 A1 | 1/2014 | Chiu et al. | |
| 2016/0372430 A1 | 12/2016 | Arvin et al. | |
| 2017/0133346 A1 | 5/2017 | Chiu et al. | |
| 2018/0076165 A1 | 3/2018 | Aoki et al. | |
| 2022/0158021 A1 | 5/2022 | Boone et al. | |

* cited by examiner

*Primary Examiner* — Douglas W Owens
(74) *Attorney, Agent, or Firm* — Yudong Kim; Frank D. Cimino

(57) ABSTRACT

In some examples, a quad flat no lead (QFN) semiconductor package comprises a flip chip semiconductor die having a surface and circuitry formed in the surface; and a conductive pillar coupled to the semiconductor die surface. The conductive pillar has a distal end relative to the semiconductor die, the distal end having a cavity including a cavity floor and one or more cavity walls circumscribing the cavity floor. The one or more cavity walls are configured to contain solder.

22 Claims, 20 Drawing Sheets

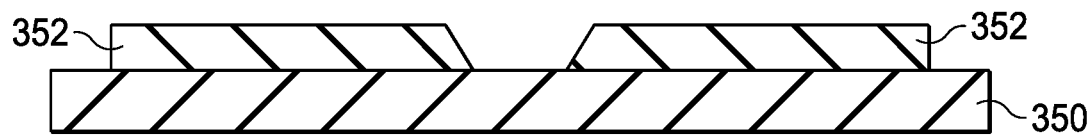
FIG. 3D1
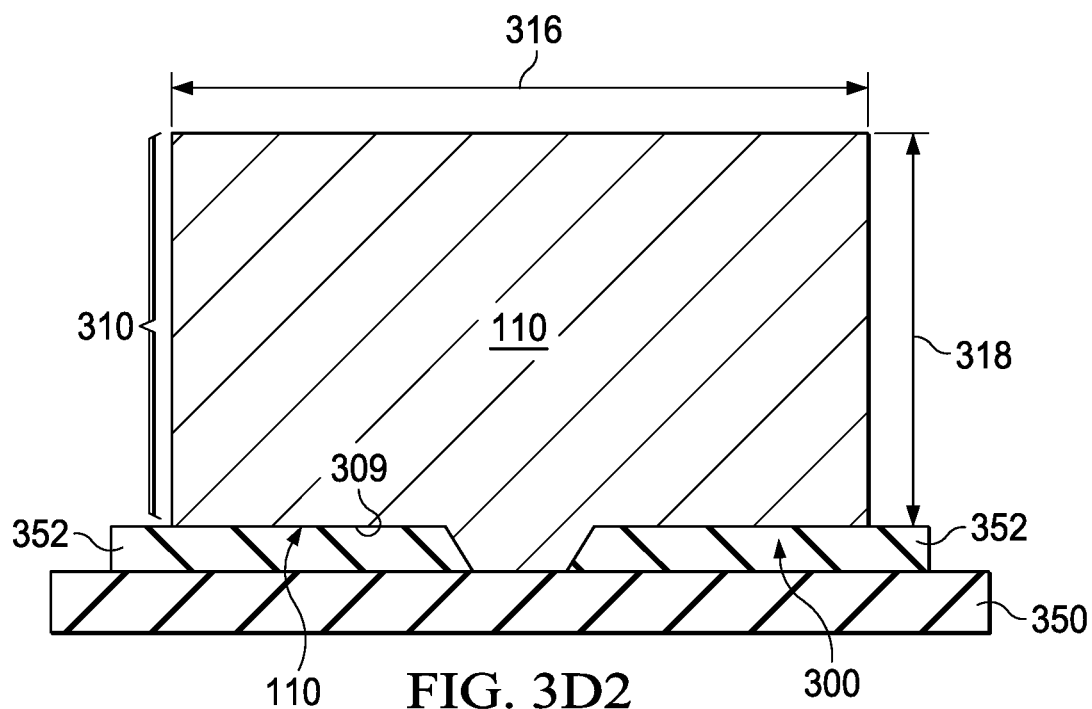
FIG. 3D2

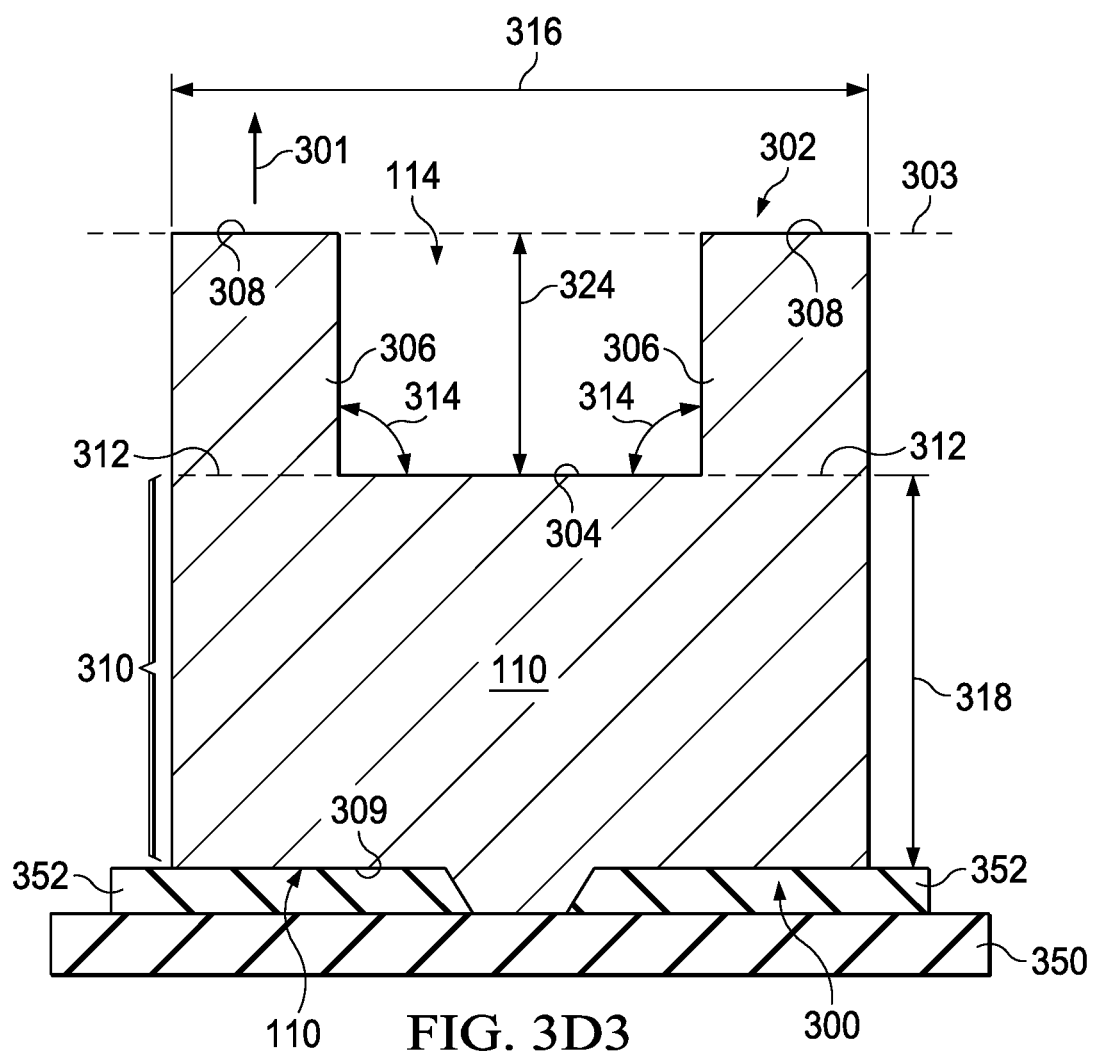
FIG. 3D3

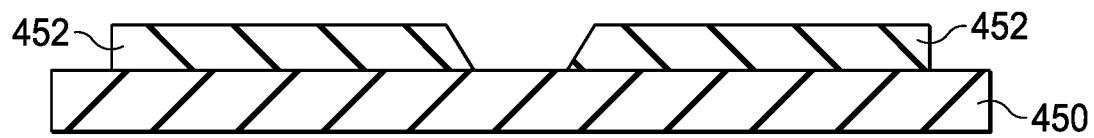
FIG. 4D1
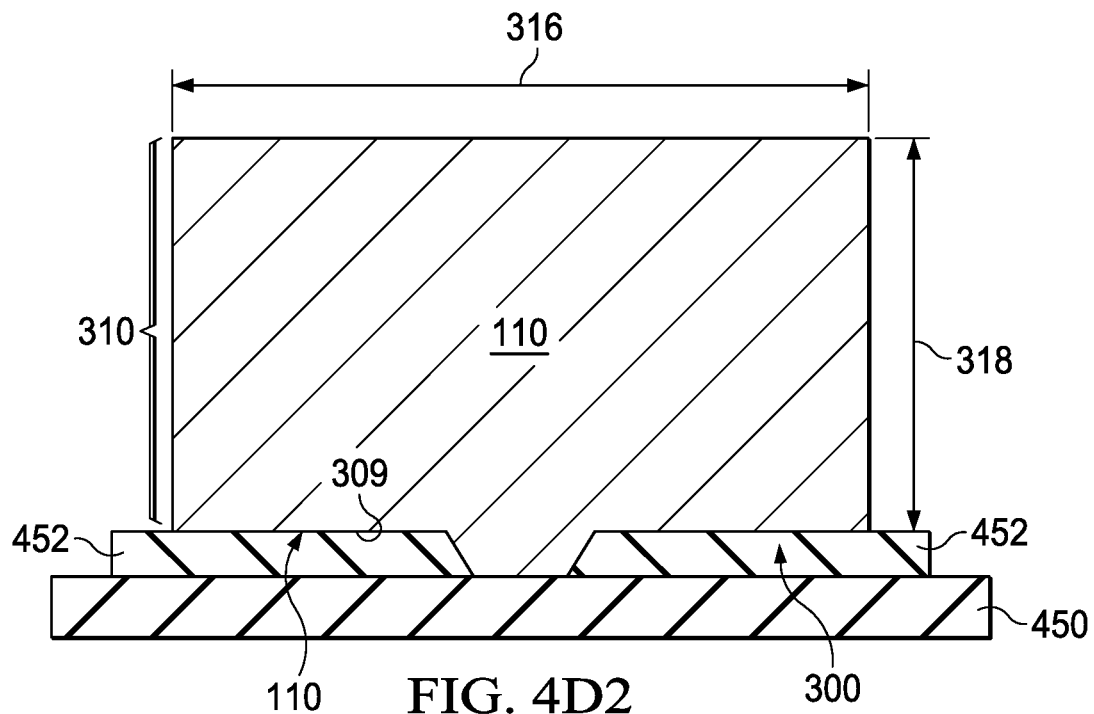
FIG. 4D2

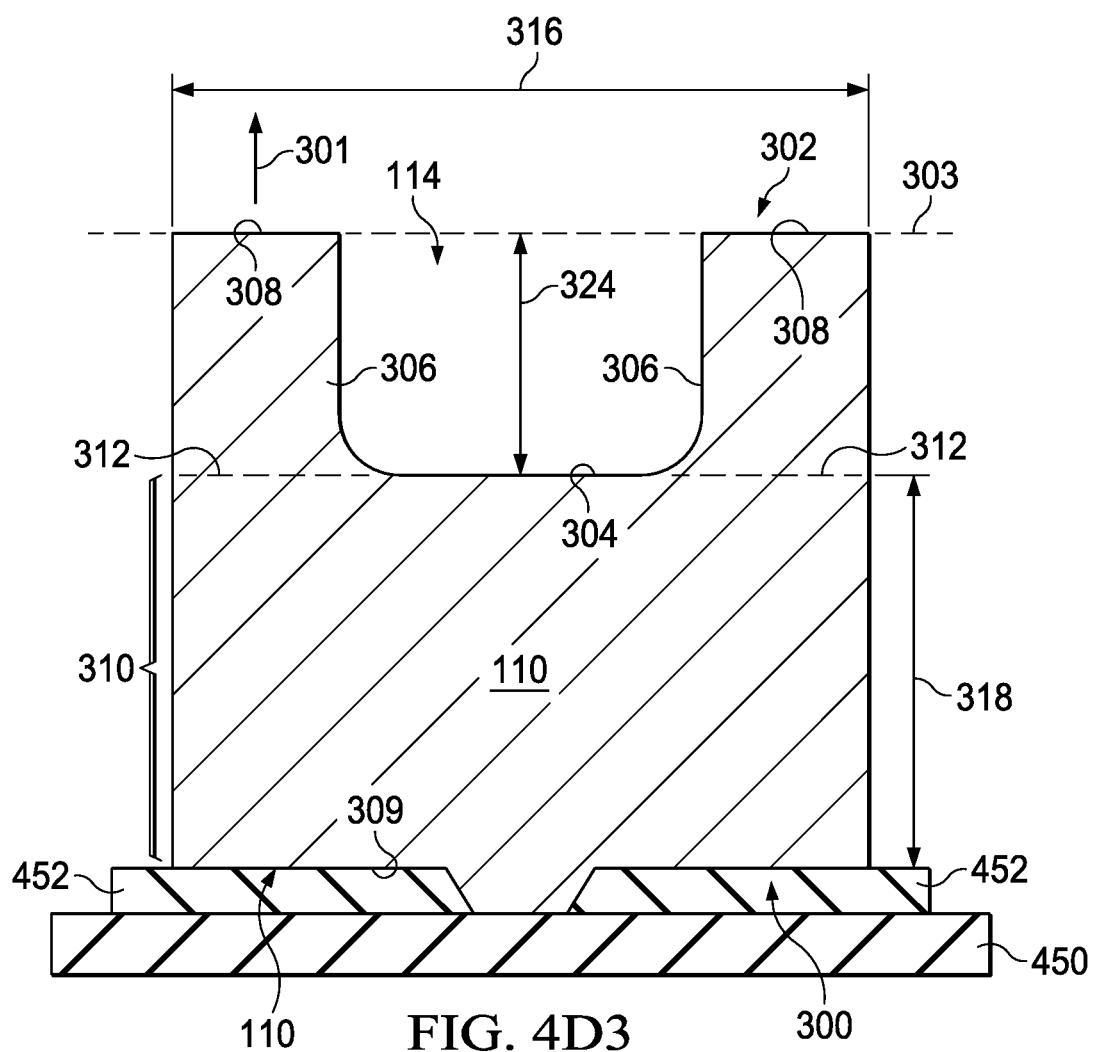
FIG. 4D3

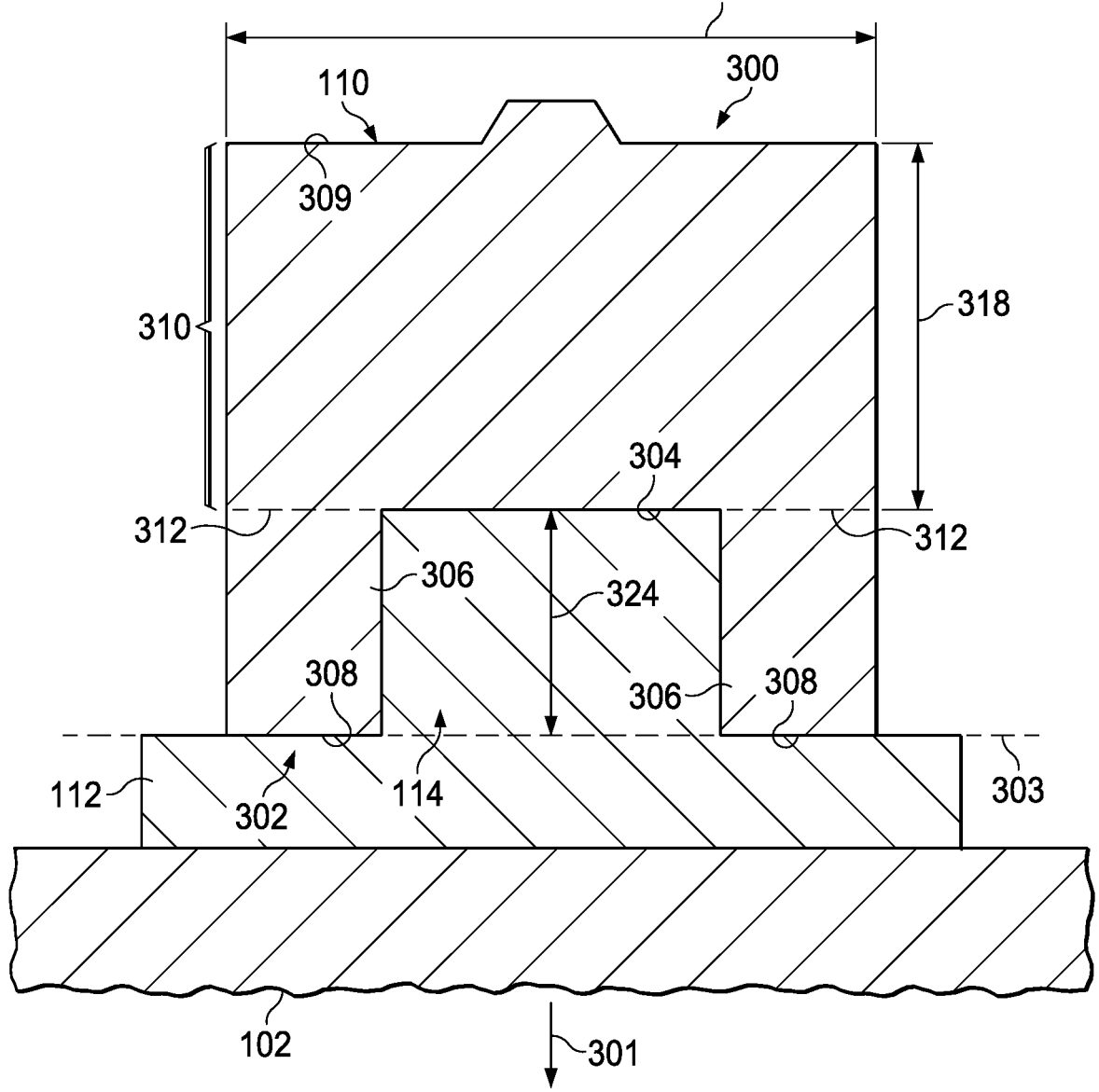

CONDUCTIVE MEMBER CAVITIES

CROSS-REFERENCE TO RELATED APPLICATIONS

The present application is a continuation of U.S. patent application Ser. No. 17/219,768, filed on Mar. 31, 2021, the contents of which are herein incorporated by reference in its entirety.

BACKGROUND

Some semiconductor packaging process flows call for the deposition of a solder ball on a conductive member, such as a copper pillar. For example, some flip-chip packages include semiconductor dies coupled to copper pillars, and the copper pillars couple to other components (e.g., package leads) via solder members formed by subjecting a solder ball to a reflow process.

SUMMARY

In some examples, a quad flat no lead (QFN) semiconductor package comprises a flip chip semiconductor die having a surface and circuitry formed in the surface; and a conductive pillar coupled to the semiconductor die surface. The conductive pillar has a distal end relative to the semiconductor die, the distal end having a cavity including a cavity floor and one or more cavity walls circumscribing the cavity floor. The one or more cavity walls are configured to contain solder.

In some examples, a method comprises forming a conductive pillar on a polyimide layer and a redistribution layer; forming a cavity in the conductive pillar using a laser ablation technique, the cavity in a surface of the conductive pillar opposite the polyimide layer; depositing a solder ball in the cavity; and performing a reflow process on the solder ball.

BRIEF DESCRIPTION OF THE DRAWINGS

FIGS. 3D1-3D3 are a process flow of a technique for manufacturing a semiconductor package in accordance with various examples.

FIGS. 4D1-4D3 are a process flow of a technique for manufacturing a semiconductor package in accordance with various examples.

FIG. 5C is a perspective view of a conductive member in accordance with various examples.

DETAILED DESCRIPTION

During manufacture, the deposition of a solder ball on a conductive member can be problematic. In some cases, a top surface of the conductive member may be slanted to a degree that causes the solder ball to roll off of the conductive member. In some cases, movement of a robotic arm used in the semiconductor packaging process may cause the inadvertent displacement of the solder ball off of the conductive member. In some cases, reflow processes introduce air flow in the vicinity of the conductive member that can cause the solder ball to roll off of the conductive member.

Further, reflow may cause the solder to flow so far away from the conductive member that the reflowed solder contacts another conductive member, or contacts solder connected to another conductive member, or contacts another conductive component in the semiconductor package. This phenomenon may be referred to as "solder bridging." Solder bridging may result in short circuits or other unintended consequences. Solder bridging cannot be mitigated by reducing the volume of solder used, because such volumes are determined by standardized manufacturing equipment and processes.

This disclosure describes various examples of a semiconductor package (e.g., a flip-chip package) that includes a conductive member having a shape and dimensions that prevent solder balls from rolling off of the conductive member and that mitigate solder bridging. In some examples, the conductive member is coupled to a semiconductor die surface. The conductive member has a distal end relative to the semiconductor die. The distal end has a cavity including a cavity floor and one or more cavity walls circumscribing the cavity floor. The one or more cavity walls are configured to preclude a solder ball deposited on the cavity floor from escaping the cavity. For example, the cavity walls may be of a certain height relative to the cavity floor, and the cavity walls may intersect with the cavity floor at right angles. Other dimensions, such as the dimensions of the cavity in the horizontal plane, may be sufficiently large to receive and hold a solder ball. Furthermore, as described above, it is generally impractical to reduce the volume of a solder ball deposited during a semiconductor packaging process flow (e.g., due to standardized manufacturing techniques and equipment). In examples, however, when the solder ball is reflowed, the cavity stores at least some of the solder and the volume of solder flowing away from the conductive member is thus lessened. In this way, the risk of solder bridging is mitigated.

Figure 1A:
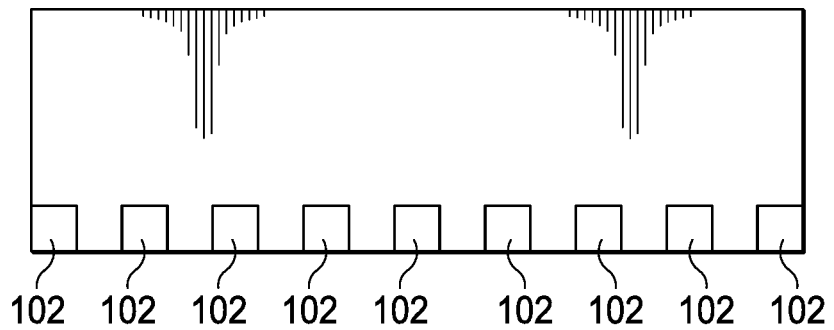
FIG. 1A is a profile view of a semiconductor package in accordance with various examples.
Figure 1B:
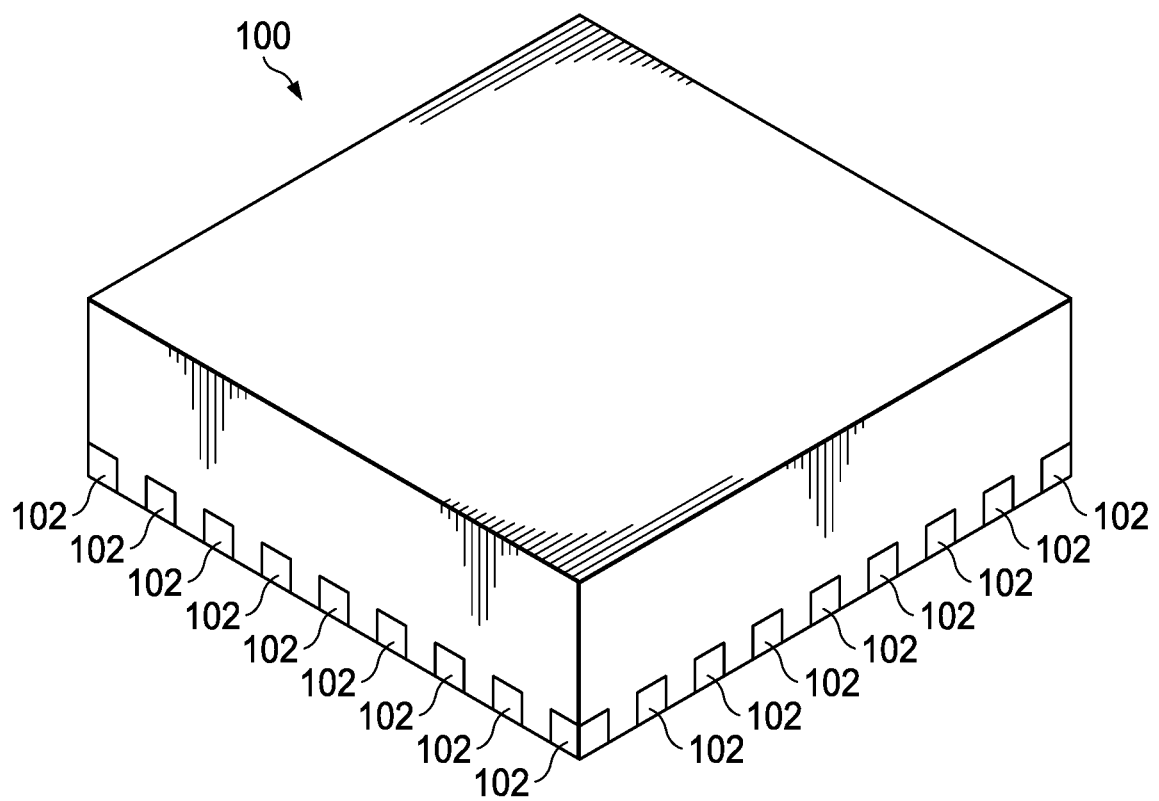
FIG. 1B is a perspective view of a semiconductor package in accordance with various examples.

FIG. 1A is a profile view of a semiconductor package 100 in accordance with various examples. The semiconductor package 100 contains a flip-chip semiconductor die (not expressly shown in FIG. 1A) coupled to conductive terminals 102. The semiconductor package 100 is shown as a quad flat no lead (QFN) package, but other types of packages, such as any package type that is able to accommodate flip-chip semiconductor die configurations, are also contemplated and included in the scope of this disclosure. The semiconductor package 100 may include, for instance, leaded packages (e.g., dual inline packages), a ball grid array (BGA) package, etc. Although this disclosure describes various examples in the context of a QFN package, any and all package types, including packages that house flip-chip semiconductor dies, are contemplated and included in the scope of this disclosure. The semiconductor package 100 includes cavities in conductive members as described in greater detail below. FIG. 1B is a perspective view of the semiconductor package 100 in accordance with various examples.

Figure 2A:
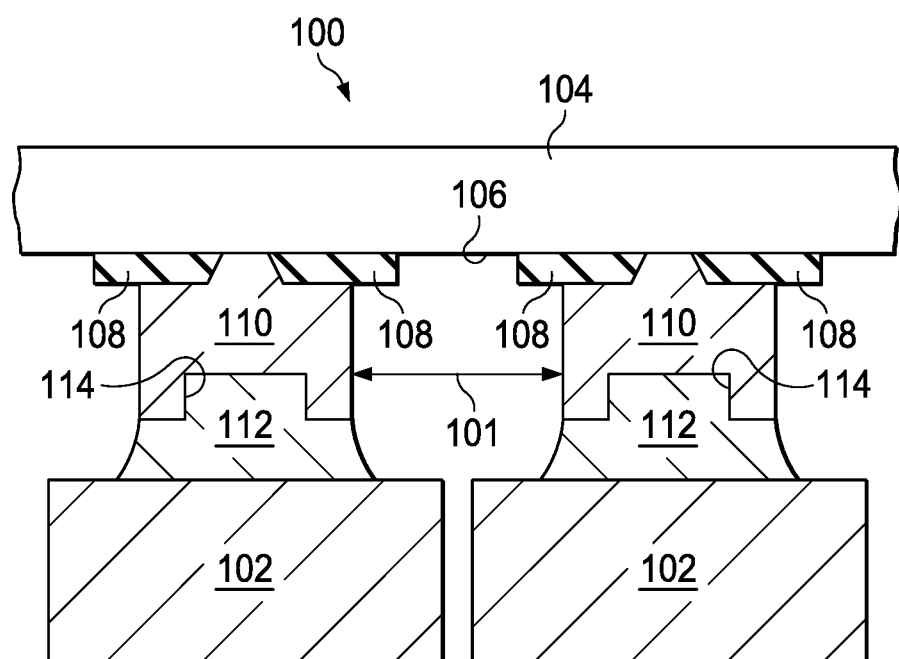
FIG. 2A is a profile cross-sectional view of contents of a semiconductor package in accordance with various examples.

FIG. 2A is a profile cross-sectional view of contents of the semiconductor package 100 in accordance with various examples. The semiconductor package 100 includes example conductive terminals 102 and an example flip-chip semiconductor die 104. By "flip-chip," it is meant that the semiconductor die 104 includes a device side 106 on and/or in which circuitry is formed and that this device side 106 faces downward, e.g., toward the conductive terminals 102. Insulative layers 108 (e.g., polyimide layers) abut the device side 106. Conductive members 110 abut the device side 106 and the insulative layers 108. In examples, the conductive members 110 include a metal. For instance, the conductive members 110 may be pillars (e.g., copper pillars). Solder members 112 couple the conductive members 110 to the conductive terminals 102. As shown, the conductive members 110 include cavities 114. The term "cavity" as used herein refers to a discontinuity in a particular material even if the discontinuity is filled fully or in part by another material. In the example of FIG. 2A, solder members 112 fill the cavities 114, but the cavities 114 are still referred to as cavities. The solder members 112 abut the conductive members 110 and the conductive terminals 102. Thus, a conductive pathway is established between the circuitry on the device side 106 and the conductive terminals 102 via the conductive members 110 and the solder members 112. Because the conductive terminals 102 are exposed to an exterior of the semiconductor package 100, electronic devices outside the semiconductor package 100 may communicate with the semiconductor die 104 through the conductive pathway described above.

As shown, the cavities 114 store at least some of the solder members 112. Given the application of a solder ball having a volume x to a conductive member having a cavity 114 and the application of a solder ball having a volume x to a conductive member lacking a cavity 114, the solder ball applied to the conductive member with the cavity 114 will result in a lesser risk of solder bridging, because at least some of the solder is contained in the cavity 114. Thus, the cavity 114 is responsible for mitigating the risk of solder bridging. In the example of FIG. 2A, solder bridging is prevented between the two conductive members 110 because at least some of the solder members 112 are stored within the cavities 114. Further, the conductive members 110 are separated by a distance 101, which is at least 30 microns, with a distance 101 less than 30 microns being disadvantageous at least because it promotes solder bridging. Solder bridging is further prevented at least in part by the limited volume of the solder members 112, which may range from 17.9 kilomicrons $(kum)^3$ to 33.5 $kum^3$, with volumes below this range being disadvantageous at least because they result in inadequate solder bond line thickness after die attach, causing suboptimal thermal cycling performance (but with reduced risk for solder cracking). Volumes above this range are disadvantageous at least because they result in unacceptably thick solder bond line thickness, thus raising the risk for solder cracks (but with improved thermal cycling). The volumes of the solder members 112 and the distance 101 are together configured to prevent the first and second solder members from physically contacting each other.

Figure 2B:
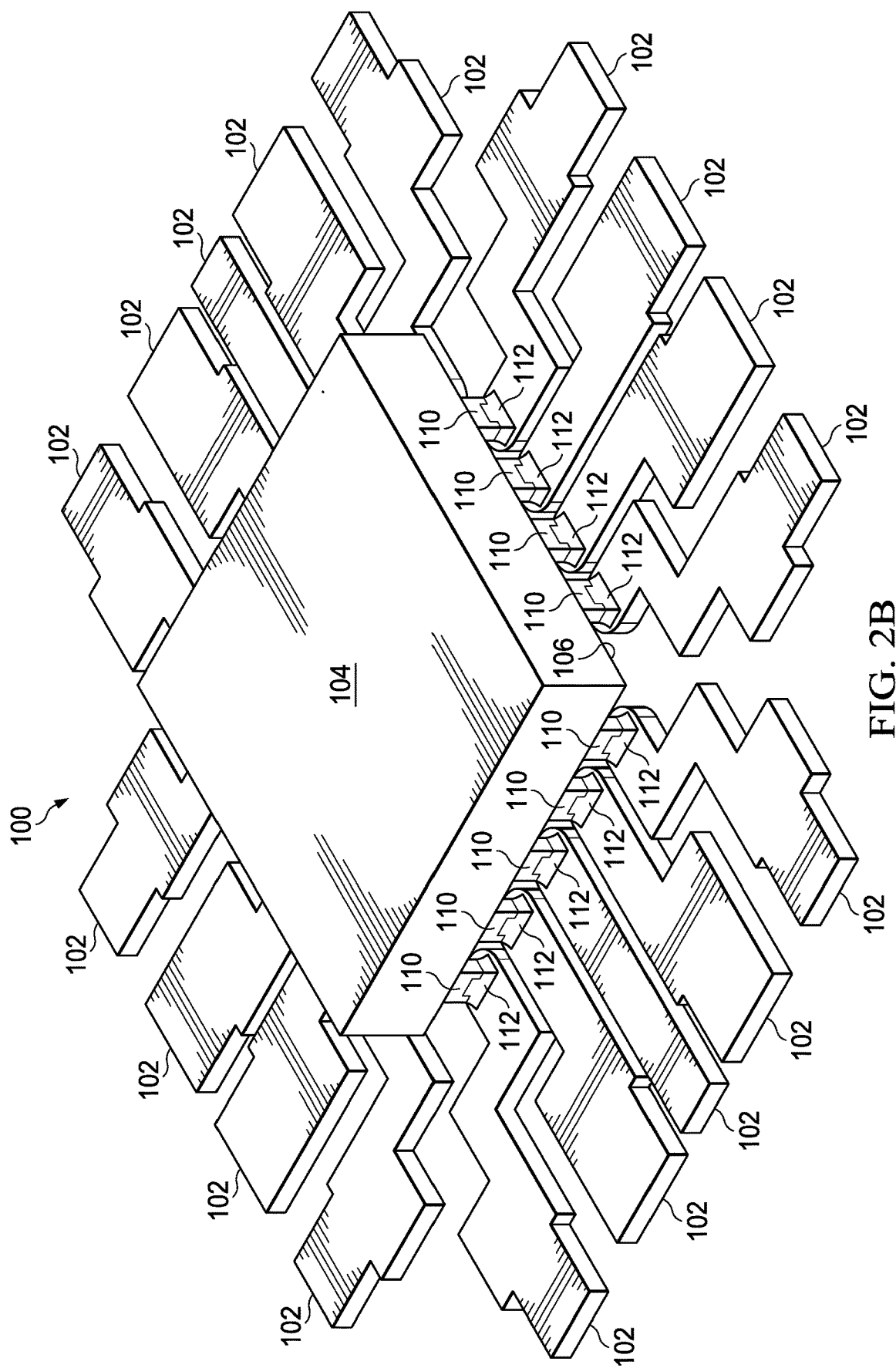
FIG. 2B is a perspective view of contents of a semiconductor package in accordance with various examples.

While FIG. 2A provides an example view of two conductive members 110 and their associated cavities 114, FIG. 2B provides a perspective view of the semiconductor die 104 and several conductive members 110 coupled to the semiconductor die 104. FIG. 2B also shows solder members 112 coupled to the conductive members 110 and to conductive terminals 102.

Figure 3A:
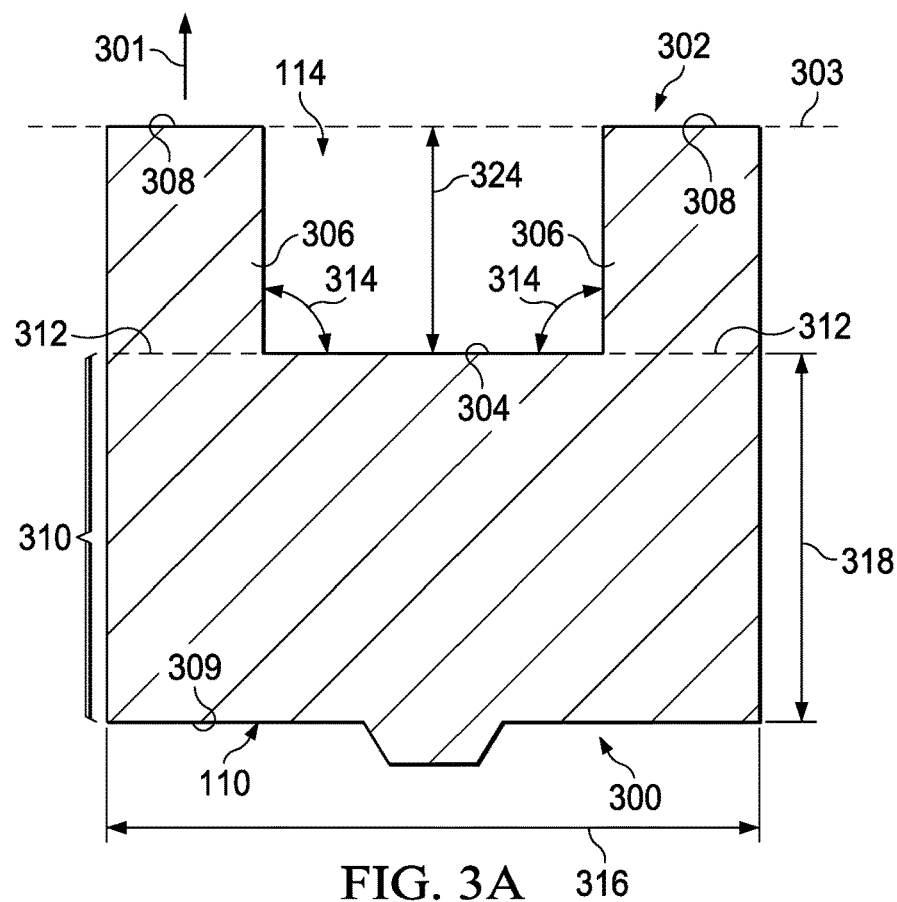
FIG. 3A is a profile cross-sectional view of a conductive member in accordance with various examples.

FIG. 3A is a profile cross-sectional view of an example conductive member 110 in accordance with various examples. The conductive member 110 shown in FIG. 3A is representative of both of the conductive members 110 shown in FIG. 2A and, more generally, of some or all of the conductive members 110 shown in FIG. 2B. The conductive member 110 includes a proximal end 300 and a distal end 302, which are proximal and distal, respectively, with respect to the semiconductor die 104 as shown in FIG. 2A. The proximal end 300 couples to the semiconductor die 104, such as to the device side 106. The distal end 302 includes the cavity 114. The cavity 114 includes a cavity floor 304 that is circumscribed by one or more cavity walls 306. The cavity floor 304 may have any suitable shape in the horizontal plane, including a rectangle, a circle, an ellipse, etc. The cavity walls 306 may be multiple separate walls, such as when the cavity floor 304 has a rectangular shape in the horizontal plane, or a single cavity wall 306 may be used, such as when the cavity floor 304 has a circular shape in the horizontal plane and the cavity wall 306 thus has a circular horizontal cross-section. The one or more cavity walls 306 include one or more surfaces 308 at the distal ends of the cavity walls 306, with each cavity wall 306 having its own surface 308. The one or more surfaces 308 face a same direction 301 as the cavity floor 304. For example, in FIG. 3A, the cavity floor 304 and the one or more surfaces 308 face upward. In some examples, the one or more surfaces 308 are positioned in a common horizontal plane 303. In some examples, the cavity floor 304 is substantially parallel to a surface 309 on the proximal end 300 of the conductive member 110. In examples, the one or more surfaces 308 are substantially parallel to the surface 309. In some examples, the cavity floor 304 is substantially flat.

The cavity 114 may be formed by any suitable technique. In some examples, the cavity 114 is formed using a laser ablation (e.g., a subtractive) technique. In some examples, the cavity 114 is formed using photolithography (e.g., an additive) technique. The cavity 114 shown in FIG. 3A is formed using an additive technique. Specifically, a main portion 310 of the conductive member 110 is formed, and then a photolithography technique may be used (e.g., using appropriately patterned masks) to additively form the cavity walls 306. In some examples, a main portion 310 of the conductive member 110 is formed, and then an additive manufacturing technique may be used to additively form the cavity walls 306. In some examples, pick-and-place techniques may be used to couple cavity walls 306 to the main portion 310 using a suitable adhesive. In some examples, the cavity walls 306 are conductive. In some examples, the cavity walls 306 are insulative.

Figure 3B:
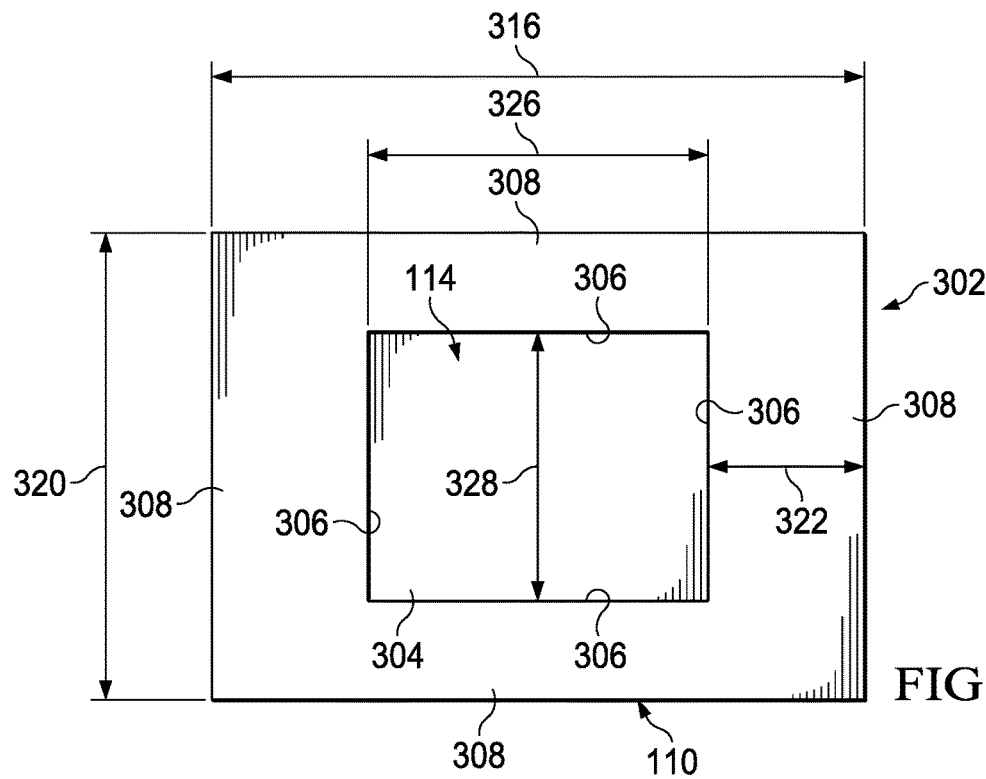
FIG. 3B is a top-down view of a conductive member in accordance with various examples.
Figure 3C:
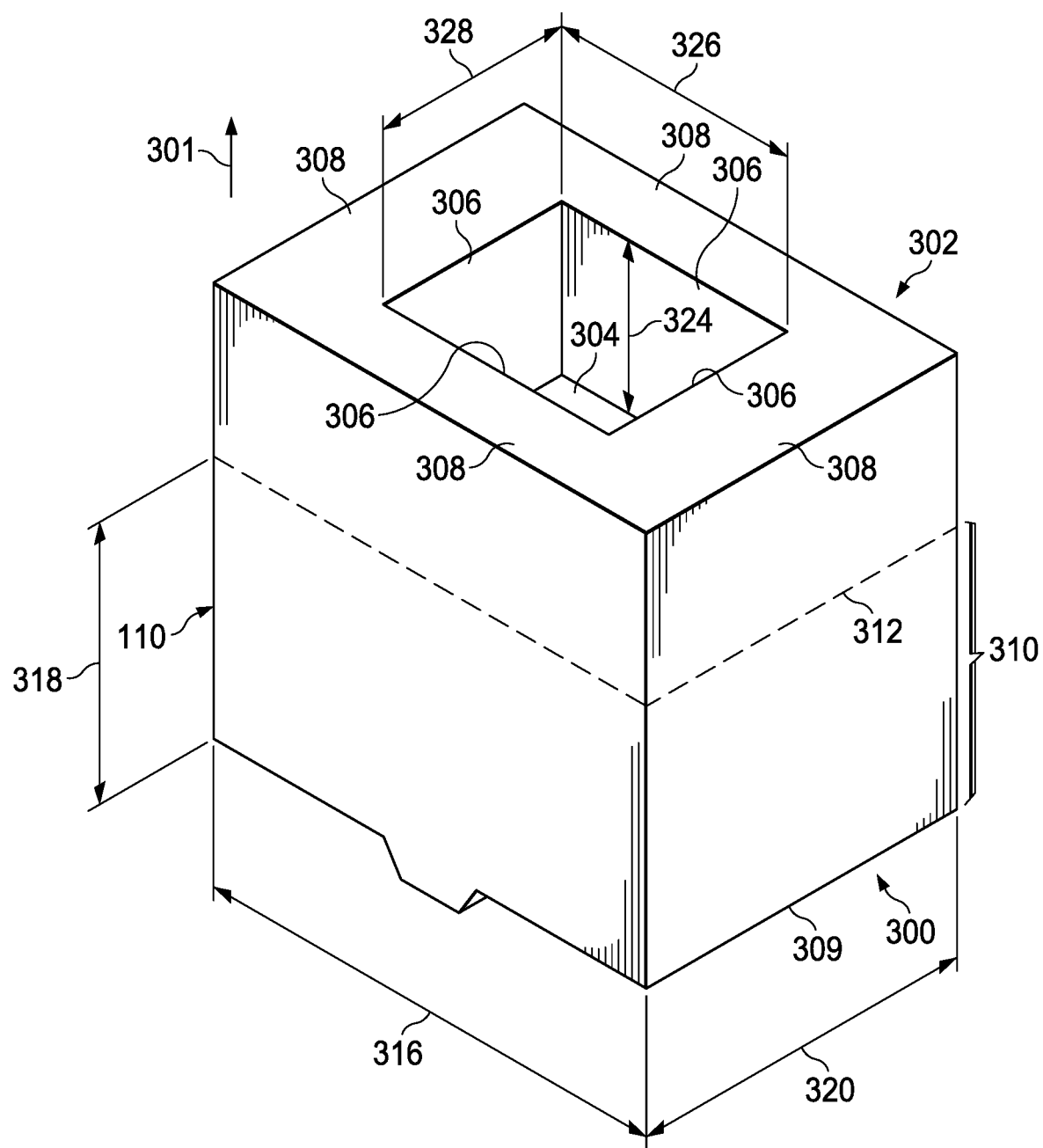
FIG. 3C is a perspective view of a conductive member in accordance with various examples.

An additively-applied cavity wall 306 may be identified at least by inspecting the grain boundary at the intersection 312 of the cavity walls 306 and the main portion 310. In such cases, the grain boundary at the intersection 312 may be mismatched, because the cavity walls 306 and the main portion 310 are not formed from a monolithic block of material. An additively-applied cavity wall 306 may be identified by comparing the grain boundaries that meet at the intersection 312 and identifying a mismatch. An additively-applied cavity wall 306 may be identified by determining whether the material forming the cavity walls 306 is the same as the material forming the main portion 310. An additively-applied cavity wall 306 also may be identified by the angle 314 of the intersection 312 of the cavity wall 306 and the cavity floor 304, which may be substantially a right angle, but which may be curved (rounded) in the case of a subtractively-formed (e.g., laser-ablated) cavity 114. FIG. 3B is a top-down view of the conductive member 110 in accordance with various examples. FIG. 3C is a perspective view of the conductive member 110 in accordance with various examples.

The dimensions of the main portion 310, the cavity walls 306, and the cavity 114 may be application-specific and may vary. The main portion 310 has a maximum length 316 of 100 microns. Examples described herein are less useful when a length 316 of the main portion 310 falls above 100 microns, because the topography of the top layer of the conductive member 110 follows the topography of the underlying layers of the conductive member 110, thus forming a conductive member 110 that is better able to retain a solder ball. Examples described herein are useful when the length 316 falls below 100 microns, because the topography of the top layer of the conductive member 110 does not properly follow the topography of the underlying layers of the conductive member 110, and thus the conductive member 110 is not able to retain the solder ball without the benefit of the novel structures described herein. The main portion 310 has a maximum width 320 of 100 microns. Examples described herein are less useful above this range for the reasons described above with reference to length 316. The main portion 310 has a height 318 of at least 30 microns. A height 318 of the main portion 310 that falls outside of this range is disadvantageous at least because it is too thin relative to the depth of the cavity to permit adequate current flow therethrough. For this reason, the cavity depth, described below, is no more than one third of the height 318. Each of the cavity walls 306 has a width 322 no larger than 30 microns. A width 322 of a cavity wall 306 outside of this range is disadvantageous at least because the cavity 114 becomes too small to hold a solder ball. Each of the cavity walls 306 has a height 324 (and thus a cavity depth) ranging from 5 microns to 25 microns. A height 324 of the cavity wall 306 greater than this range is disadvantageous at least because it promotes solder voids between conductive members, thus resulting in diminished current flow. A height 324 less than this range is disadvantageous at least because it does not enable adequate solder control due to an excessive amount of solder, thereby raising the risk of solder bridging. The lengths of the cavity walls 306 in the horizontal plane are commensurate with the measurements (e.g., length 316 and width 320) of the main portion 310 in the horizontal plane.

The cavity 114 has a length 326 ranging from 20 microns to 40 microns. A length 326 of the cavity 114 outside of this range is disadvantageous at least because the length is inadequate to provide a sufficiently large cavity 114 to control solder flow, or the length may be too large and voiding becomes prominent and results in poor current flow. The cavity 114 has a width 328 having the same range as the length 326, and the disadvantages of having widths 328 outside of that range are the same as the disadvantages of having lengths outside of the range for length 326 as described above. The cavity 114 has a volume ranging from 3.6 kum$^3$ to 6.7 kum$^3$, with a volume lower than this range being disadvantageous at least because it results in a post-die attach solder bond line thickness that has poor thermal cycling performance, and with a volume higher than this range being disadvantageous at least because it degrades solder flow control and increases the risk of solder bridging. In addition, a volume higher than this range results in a higher risk for an unacceptably large bond line thickness and the attendant degradation in electromigration performance. The angles 314 range from 75° to 95°. An angle 314 outside of this range is disadvantageous at least because it negatively affects the structural integrity of the conductive member 110, for example, by causing the cavity walls 306 to buckle.

Figure 8:
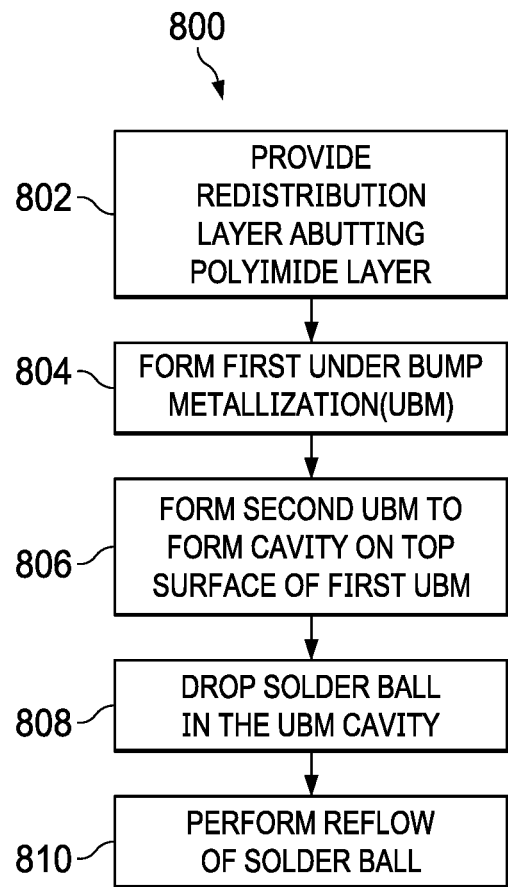
FIG. 8 is a flow diagram of a method for manufacturing the structures of FIGS. 3A-3C.

FIGS. 3D1-3D3 are a process flow illustrating the manufacture of the structures of FIGS. 3A-3C. FIG. 8 is a flow diagram of a method 800 for manufacturing the structures of FIGS. 3A-3C. Accordingly, FIGS. 3D1-3D3 and 8 are now described in parallel. The method 800 begins with providing a redistribution layer (RDL) abutting a polyimide (PI) layer (802). FIG. 3D1 is a profile cross-sectional view of a portion of an RDL 350 abutting a PI layer 352. The RDL 350 and PI layer 352 may be formed in any suitable manner and in any suitable configuration, depending on the application. The method 800 includes forming a first under bump metallization (UBM) (804). FIG. 3D2 is a profile cross-sectional view showing the formation of the conductive member 110 on the PI layer 352 and coupled to the RDL 350. In some examples, a photolithography technique is used, although other techniques are contemplated and included in the scope of this disclosure. The conductive member 110 is an example of the first UBM described in 804. The method 800 includes forming a second UBM to form a cavity on the top surface of the first UBM (806). As described above, the second UBM may be formed using any suitable technique, such as a photolithography technique. FIG. 3D3 is a profile cross-sectional view showing the formation of the cavity 114 by the formation of one or more cavity walls 306 via the second UBM process. The one or more cavity walls 306 are an example of the second UBM described in 806. As described herein, the one or more cavity walls 306 may have a circular cross-sectional shape and thus be a single cavity wall 306, or the one or more cavity walls 306 may have a polygonal (e.g., rectangular) cross-sectional shape and thus include multiple cavity walls 306. The method 800 includes dropping a solder ball in the UBM cavity (808), which is described below with reference to FIGS. 5A and 5B. The method 800 includes performing a reflow process of the solder ball (810), which is described below with reference to FIG. 5C.

Figure 4A:
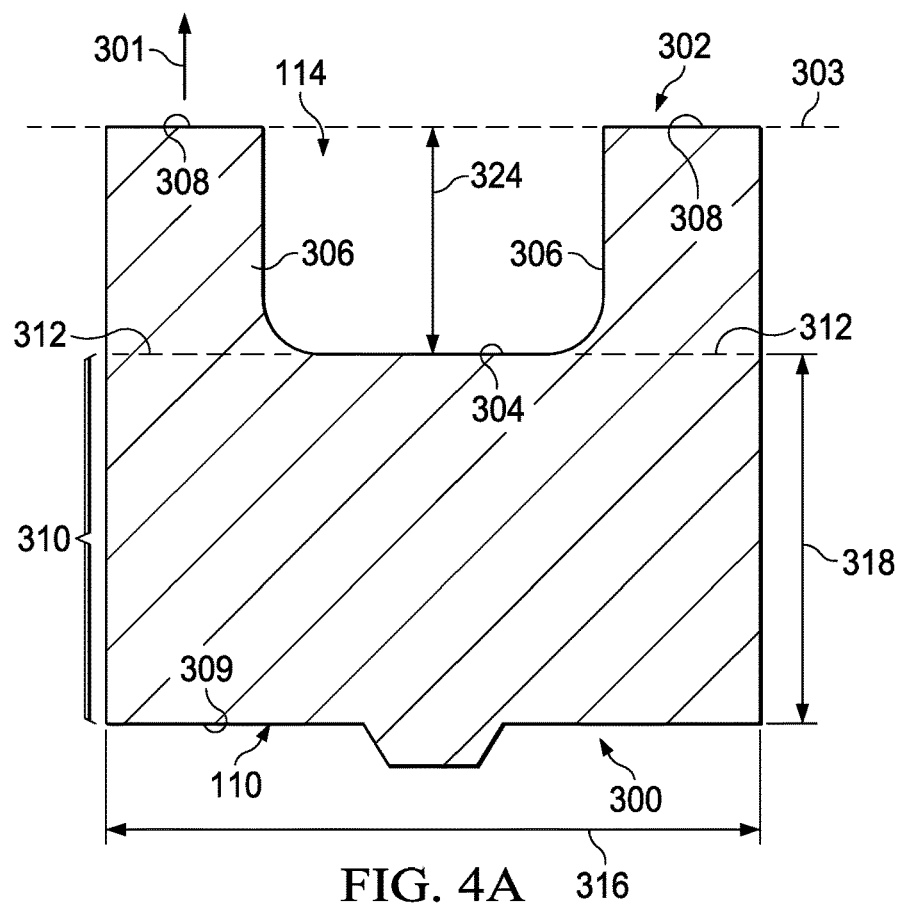
FIG. 4A is a profile cross-sectional view of a conductive member in accordance with various examples.
Figure 4B:
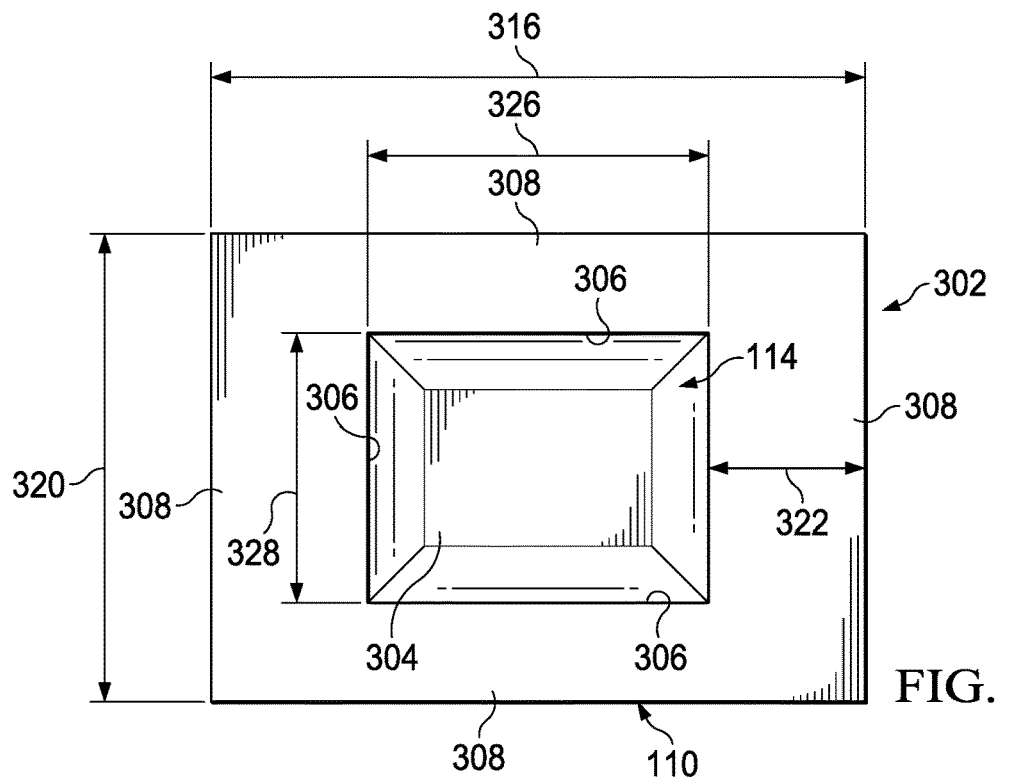
FIG. 4B is a top-down view of a conductive member in accordance with various examples.
Figure 4C:
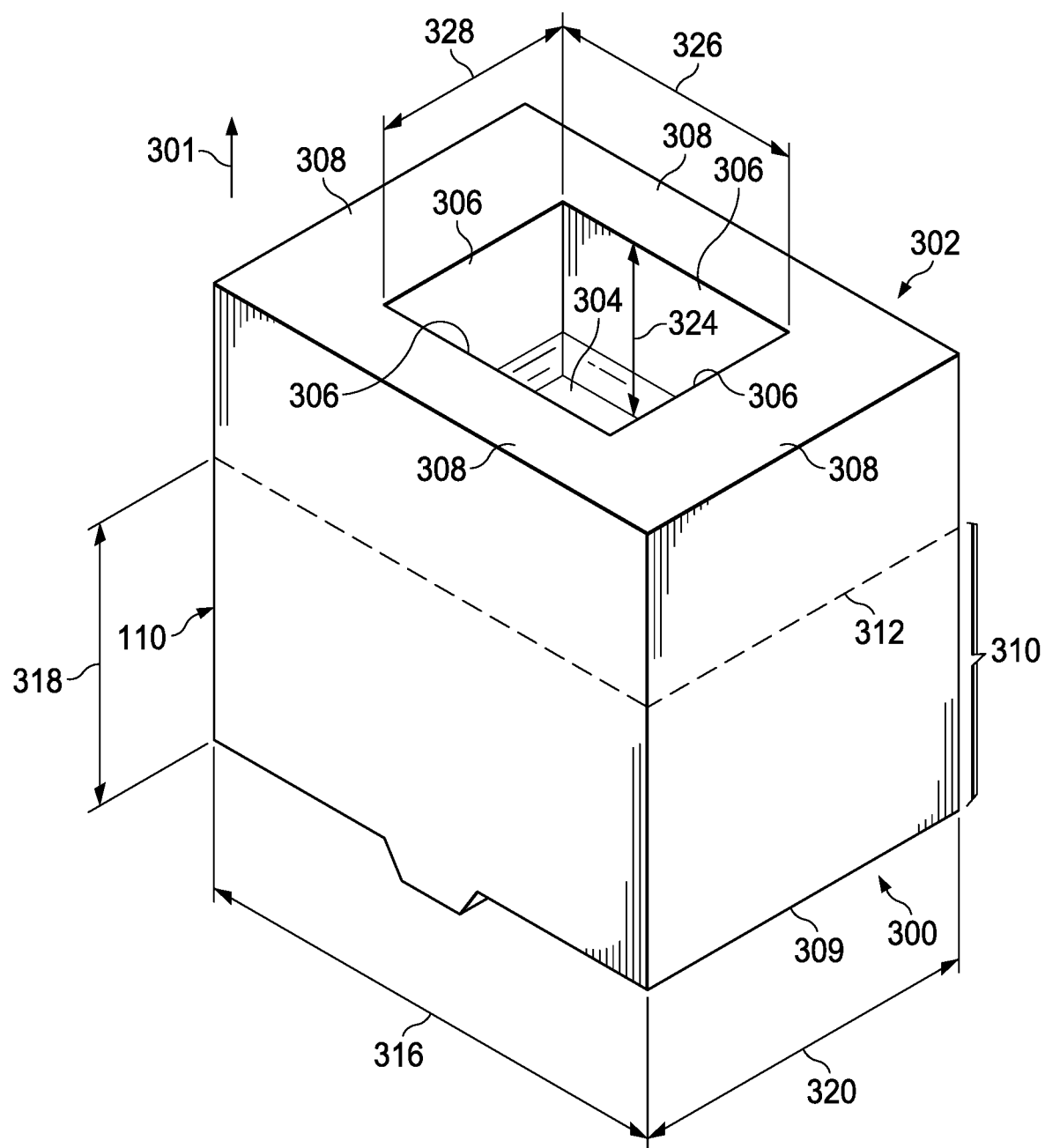
FIG. 4C is a perspective view of a conductive member in accordance with various examples.

FIG. 4A is a profile cross-sectional view of a conductive member 110 in accordance with various examples. The example conductive member 110 of FIG. 4A is identical to the example conductive member 110 of FIGS. 3A-3C, except that the angles 314 of FIG. 3A are no longer present and are replaced by rounded corners where the cavity floor 304 meets the cavity walls 306. As described above, rounded corners may be present when the cavity 114 is formed using a subtractive technique, and angular corners (e.g., angles 314) may be present when the cavity 114 is formed using an additive technique. Rounded corners have a curvature ranging from 1.3 to 1.8 radians per second, with a curvature falling below this range being disadvantageous at least because it substantially reduces the ability to catch a solder ball, and a curvature falling above this range being disadvantageous at least because it substantially reduces the ability to retain a solder ball. FIG. 4B is a top-down view of the conductive member 110 of FIG. 4A in accordance with various examples. FIG. 4C is a perspective view of the conductive member 110 of FIG. 4A in accordance with various examples.

Figure 9:
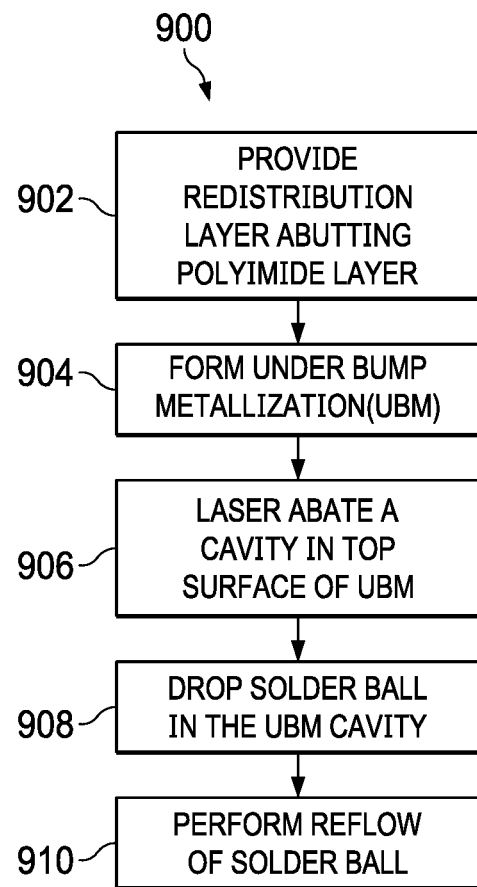
FIG. 9 is a flow diagram of a method for manufacturing the structures of FIGS. 4A-4C.

FIGS. 4D1-4D3 are a process flow illustrating the manufacture of the structures of FIGS. 4A-4C. FIG. 9 is a flow diagram of a method 900 for manufacturing the structures of FIGS. 4A-4C. Accordingly, FIGS. 4D1-4D3 and 9 are now described in parallel. The method 900 begins with providing an RDL abutting a PI layer (902). FIG. 4D1 is a profile cross-sectional view showing a portion of an RDL 450 abutting a PI layer 452. The method 900 includes forming a UBM (904). FIG. 4D2 is a profile cross-sectional view of a conductive member 110 abutting the PI layer 452 and coupled to the RDL 450. The conductive member 110 is an example of the UBM of 904. The method 900 includes laser ablating a cavity in the top surface of the UBM (906). Laser ablation is the process of removing material from a solid (e.g., the conductive member 110) by irradiating the solid with a laser beam. In examples, the laser ablation process may include the use of a Nd:YAG laser, with a strength in the range of 15-20 watts and a duration of 5-12 seconds, and with one or more application iterations, as may be appropriate. FIG. 4D3 depicts the formation of the cavity 114 in the top surface of the conductive member 110 by laser ablation. The cavity 114 includes one or more cavity walls 306, as shown. The one or more cavity walls 306 may have any suitable cross-sectional shape, including circular, rectangular, etc. The method 900 includes dropping a solder ball in the UBM cavity (908), as described below with reference to FIGS. 6A and 6B, and performing a reflow of the solder ball (910), as described below with reference to FIG. 6C.

Figure 5A:
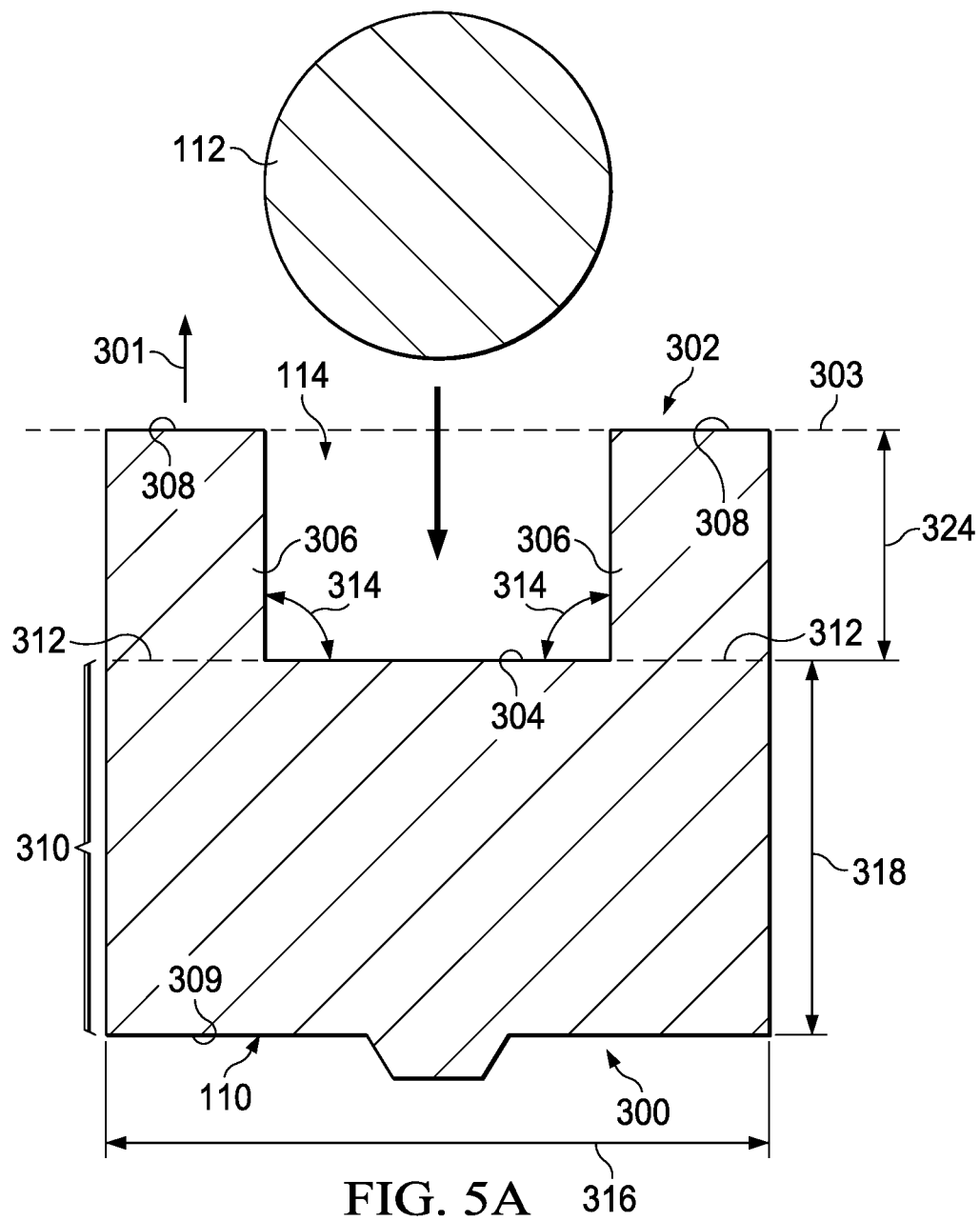
FIG. 5A is a profile cross-sectional view of a solder ball being deposited into a cavity of a conductive member in accordance with various examples.
Figure 5B:
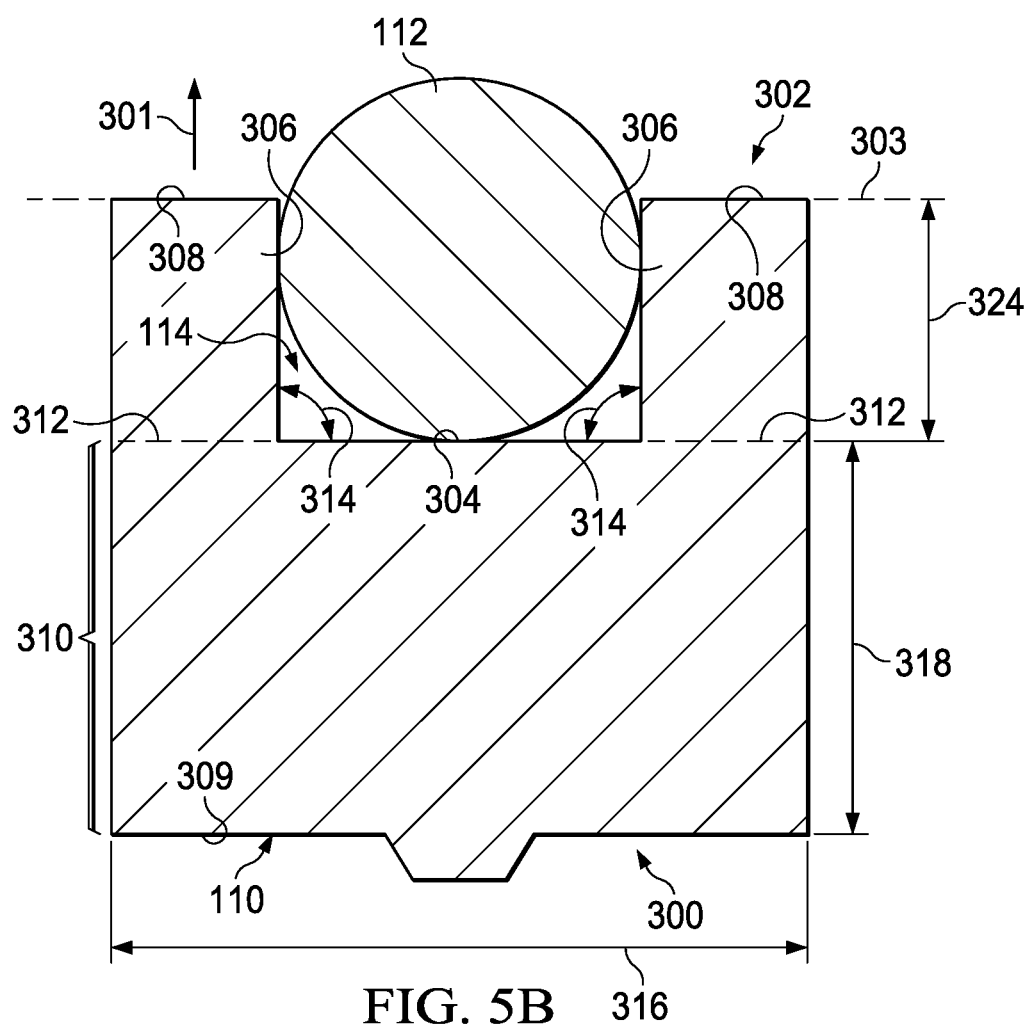
FIG. 5B is a top-down view of a solder ball positioned in a cavity of a conductive member in accordance with various examples.

FIGS. 5A-5C show the formation of the solder member connections of FIGS. 2A and 2B. Specifically, FIG. 5A is a profile cross-sectional view of a solder member 112 being deposited into a cavity 114 of a conductive member 110 in accordance with various examples. The solder member 112 may be deposited into the cavity 114 by an electroplating or electroless plating technique or a solder ball drop attach technique, for example. As shown, the solder member 112 at least partially fills the cavity 114. The solder member 112 abuts the one or more surfaces 308 of the multiple cavity walls 306. The solder member 112 abuts the one or more cavity walls 306, such as the surfaces of the cavity walls 306 that face each other. FIG. 5B is a top-down view of the solder member 112 positioned in the cavity 114 of the conductive member 110 in accordance with various examples. FIG. 5C is a perspective view of the conductive member 110 coupled to a conductive terminal 102 by way of the solder member 112, in accordance with various examples. The solder member 112 transforms from a solder ball (e.g., FIGS. 5A and 5B) by way of a solder reflow process, for example.

Figure 6A:
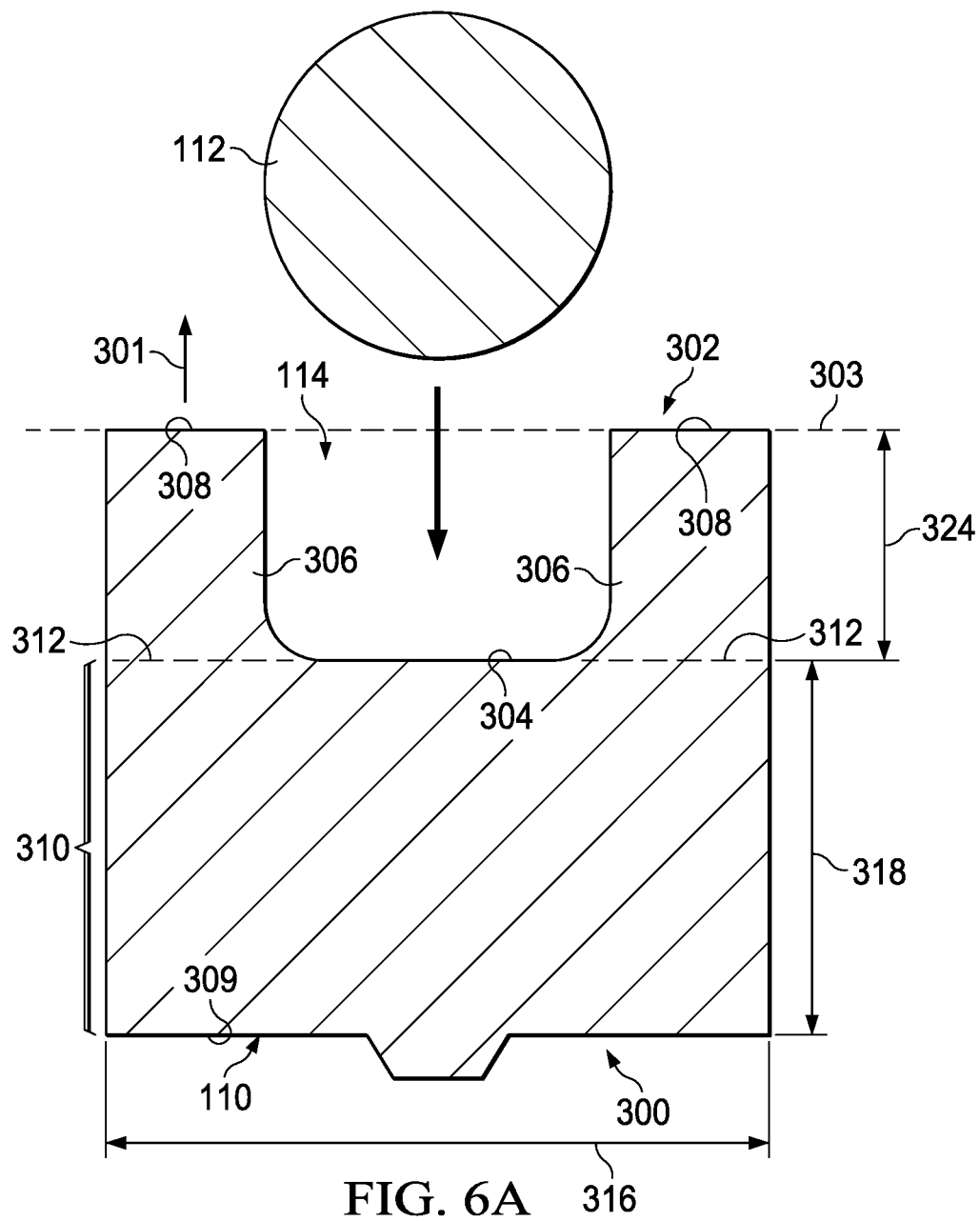
FIG. 6A is a profile cross-sectional view of a solder ball being deposited into a cavity of a conductive member in accordance with various examples.
Figure 6B:
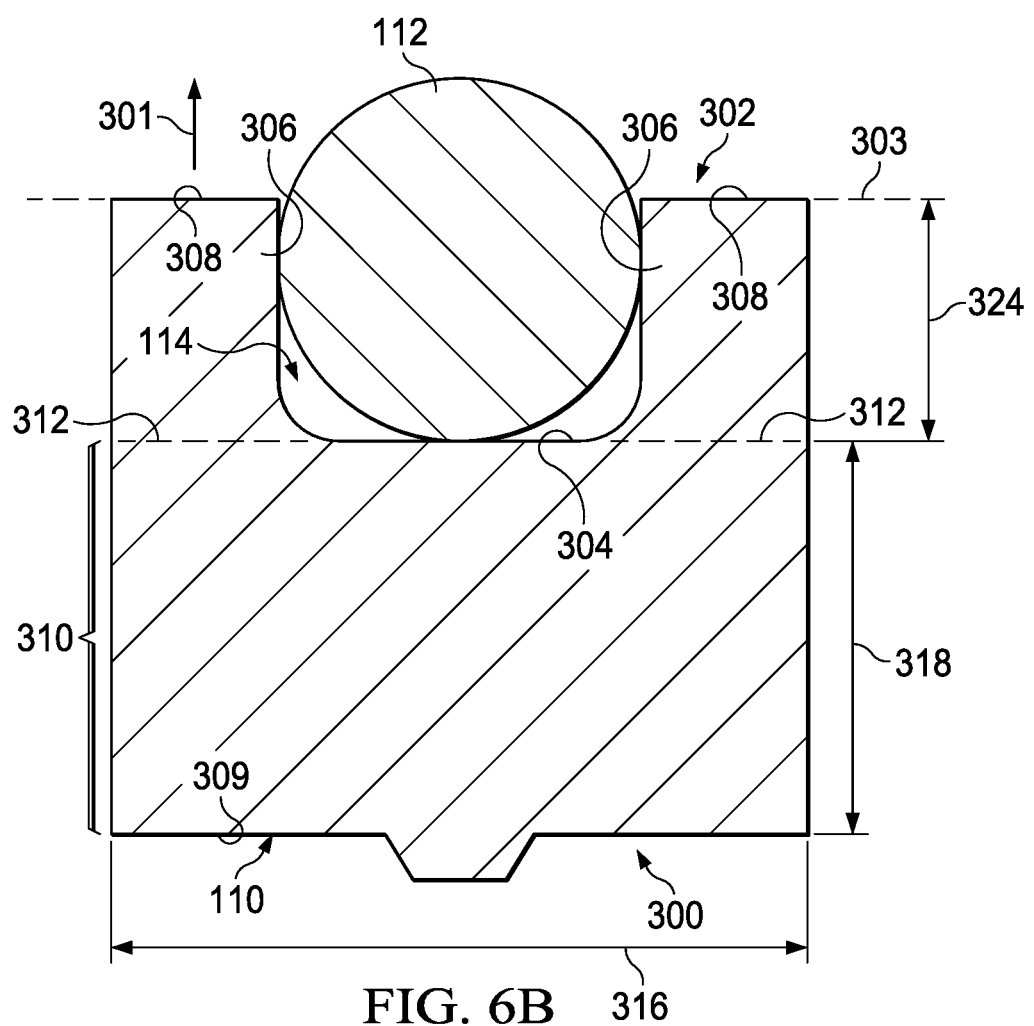
FIG. 6B is a top-down view of a solder ball positioned in a cavity of a conductive member in accordance with various examples.
Figure 6C:
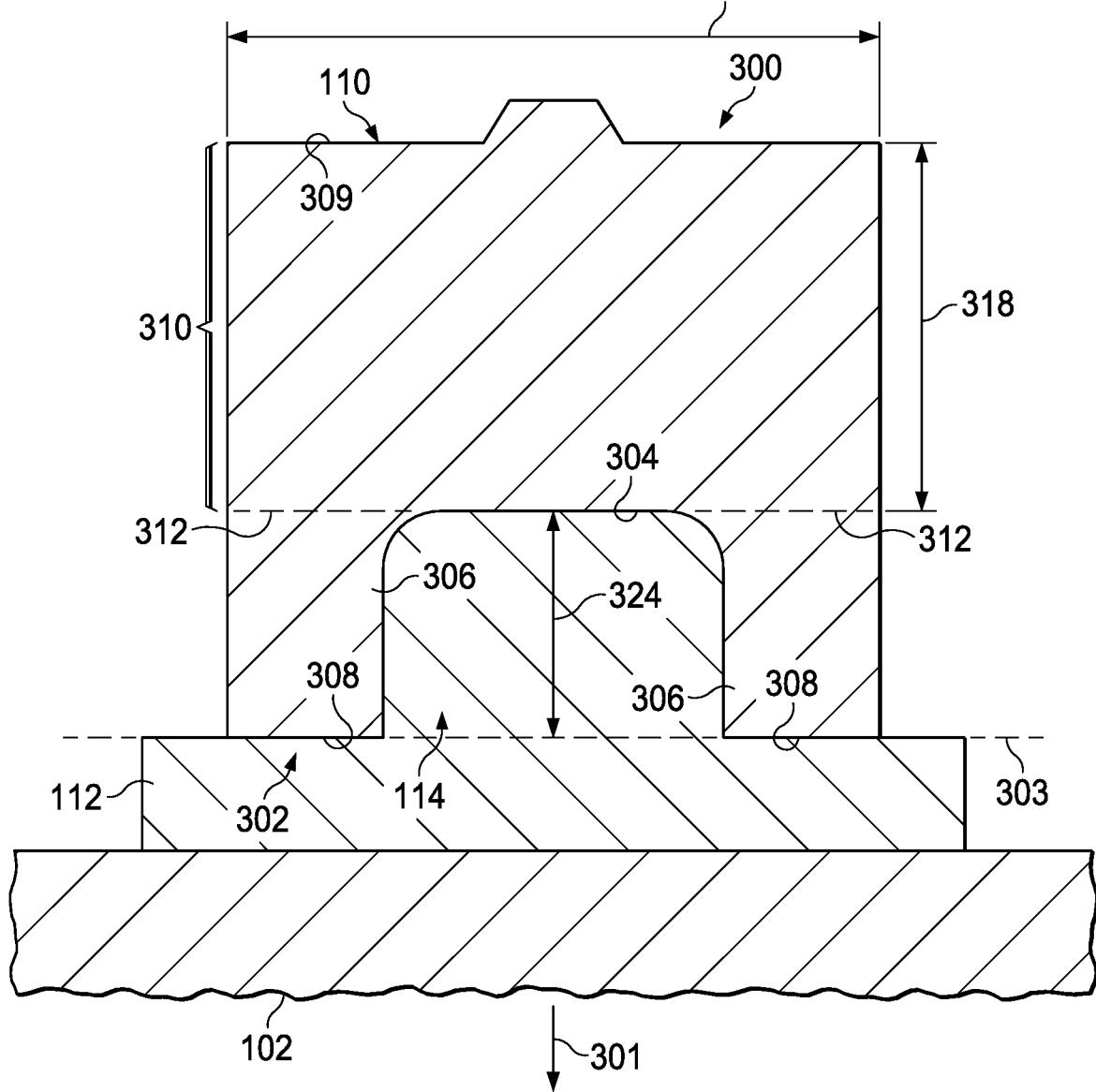
FIG. 6C is a perspective view of a conductive member in accordance with various examples.

FIGS. 6A-6C are identical to FIGS. 5A-5C respectively, except that the cavities 114 of the conductive members 110 shown in FIGS. 6A-6C include rounded corners, such as those described above with reference to FIGS. 4A-4C.

Figure 7A:
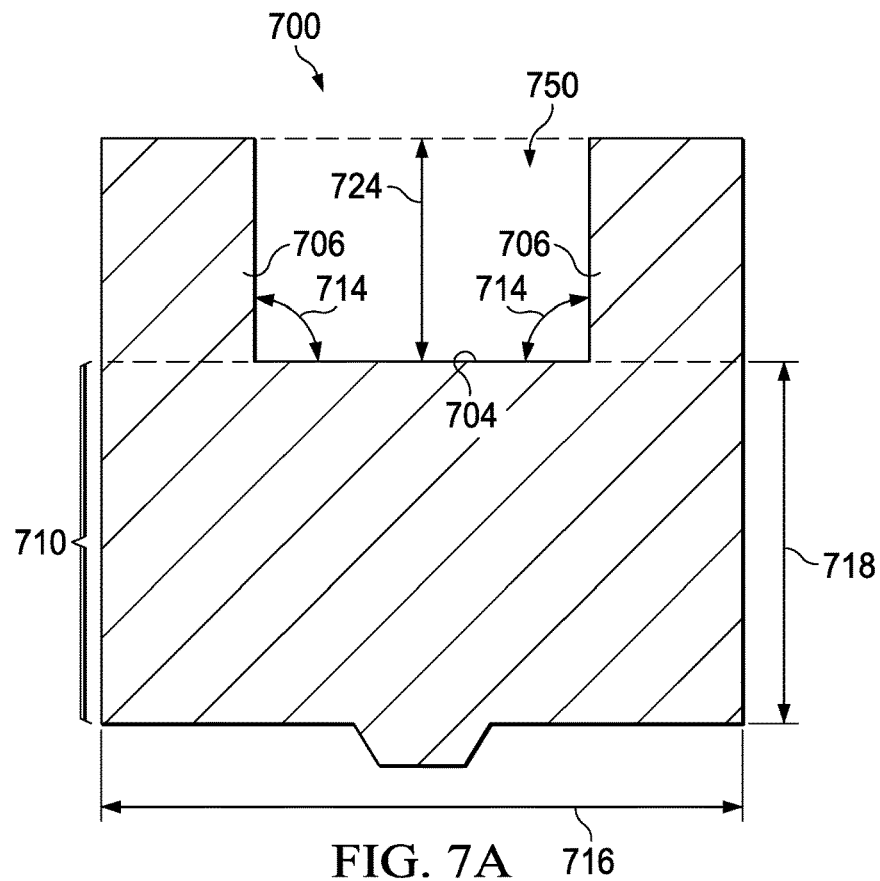
FIG. 7A is a profile cross-sectional view of a conductive member in accordance with various examples.
Figure 7B:
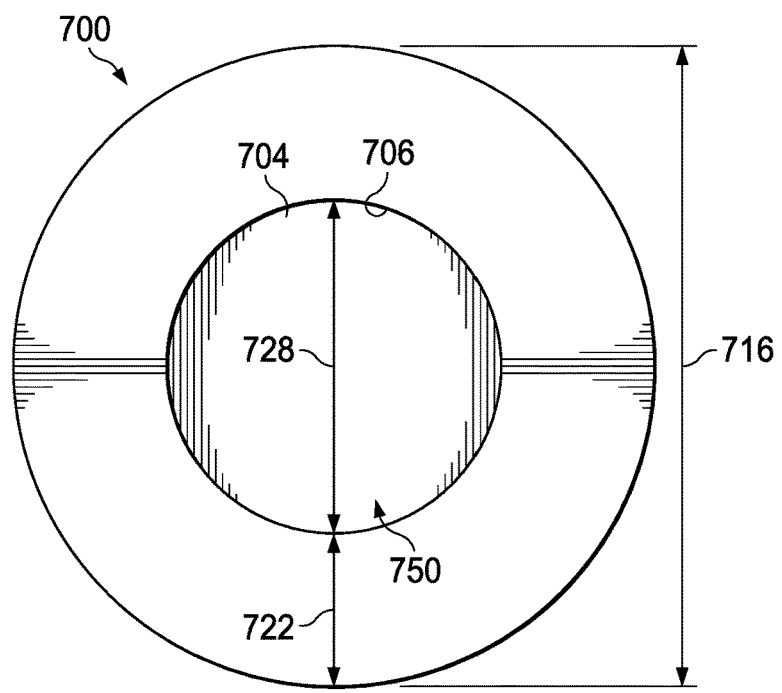
FIG. 7B is a top-down view of a conductive member in accordance with various examples.
Figure 7C:
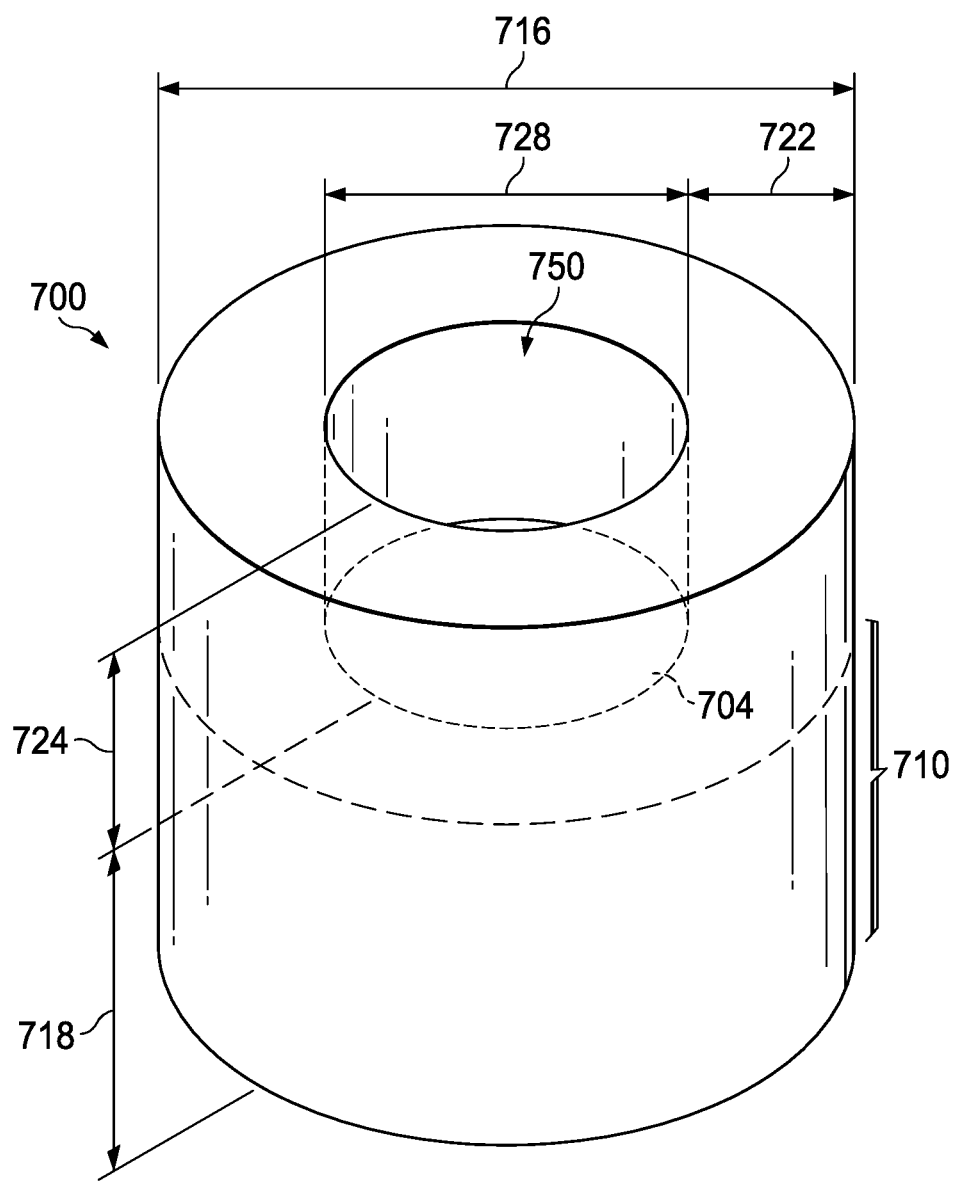
FIG. 7C is a perspective view of a conductive member in accordance with various examples.

The scope of this disclosure is not limited to conductive members of any particular shape. For example, FIGS. 7A-7C are profile cross-sectional, top-down, and perspective views of a cylindrical conductive member 700. The cylindrical conductive member 700 includes a main portion 710 and a cavity wall 706. The cavity wall 706 circumscribes and defines a cavity 750. The main portion 710 has a height 718. The height 718 has a range identical to that of height 318 described above, and the disadvantages of a height 718 that is above or below that range are the same as the disadvantages of a height 318 above or below that range.

The main portion 710 has a diameter 716. The diameter 716 has a range that is identical to that of the length 316 described above. The disadvantages of a diameter 716 that is above or below that range are the same as the disadvantages of a length 316 that is above or below that range.

The cavity 750 has a height (or cavity depth) 724. An angle 714 is formed where the cavity wall 706 meets a cavity floor 704. The angle 714 has the same range as the angle 314, and the same disadvantages exist when the angle 714 is outside that range as when the angle 314 is outside that range.

FIG. 7B is a top-down view of the cylindrical conductive member 700. As shown, the cavity 750 has a diameter 728. The diameter 728 has a range that is the same as that of the width 328. The disadvantages of a diameter 728 that is outside this range are the same as the disadvantages of a width 328 that is outside this range. The cavity wall 706 has a width 722 that has the same range as the width 322. The disadvantages of a width 722 that is outside this range are the same as the disadvantages of a width 322 that is outside this range. FIG. 7C is a perspective view of the cylindrical conductive member 700.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided or provided by device A.

While certain components may be described herein as being of a particular process technology, these components may be exchanged for components of other process technologies. Unless otherwise stated, "about", "approximately", or "substantially" preceding a value means +/−10 percent of the stated value. Modifications are possible in the described examples, and other examples are possible, within the scope of the claims.

What is claimed is:
1. A semiconductor package, comprising:
   a semiconductor die having a device side;
   a conductive pillar coupled to the device side and having
      a distal end relative to the semiconductor die, the distal end including a cavity having a cavity floor that is substantially flat and is circumscribed by one or more cavity walls; and a solder member at least partially filling the cavity.

2. The semiconductor package of claim 1, wherein the cavity has a volume ranging from 3.6 kum3 to 6.7 kum3.

3. The semiconductor package of claim 1, wherein the cavity has a depth ranging from 5 microns to 25 microns.

4. The semiconductor package of claim 1, wherein the conductive pillar has a footprint of a closed shape including circular and rectangular shapes.

5. The semiconductor package of claim 1, wherein the one or more cavity walls include a closed shape including circular and rectangular shapes.

6. The semiconductor package of claim 1, wherein the cavity floor has a length or diameter ranging from 20 microns to 40 microns.

7. The semiconductor package of claim 1, wherein the cavity floor meets the one or more cavity walls at an angle ranging from 75° to 95°.

8. The semiconductor package of claim 1, wherein an intersection of the cavity floor and the one or more cavity walls includes a rounded corner.

9. A semiconductor package, comprising:
a semiconductor die having a device side;
a conductive pillar coupled to the device side, the conductive pillar including a main portion having a first side facing toward the device side and a wall portion on a second side of the main portion opposite the first side, wherein the wall portion circumscribes a center portion of the second side creating a cavity on the second side; and
a solder member at least partially filling the cavity;
wherein the second side of the main portion uncovered by the wall portion is substantially flat.

10. The semiconductor package of claim 9, wherein the conductive pillar has a footprint of a closed shape including circular and rectangular shapes.

11. The semiconductor package of claim 9, wherein the center portion uncovered by the wall portion has a length or diameter ranging from 20 microns to 40 microns.

12. A semiconductor package, comprising:
a semiconductor die having a device side;
a conductive pillar coupled to the device side, the conductive pillar including a main portion having a first side facing toward the device side and a wall portion on a second side of the main portion opposite the first side, wherein the wall portion circumscribes a center portion of the second side creating a cavity on the second side; and
a solder member at least partially filling the cavity;
wherein:

the main portion has a first height; and
the wall portion has a second height that is less than one third of the first height.

13. The semiconductor package of claim 9, wherein the main portion has a height of at least 30 microns.

14. The semiconductor package of claim 9, wherein the wall portion has a height ranging from 5 microns to 25 microns.

15. The semiconductor package of claim 9, wherein the cavity has a volume ranging from 3.6 kum3 to 6.7 kum3.

16. The semiconductor package of claim 9, wherein the wall portion is insulative.

17. The semiconductor package of claim 9, wherein the main portion and the wall portion have a same material.

18. The semiconductor package of claim 9, wherein the wall portion meets the main portion at an angle ranging from 75° to 95°.

19. The semiconductor package of claim 9, wherein an intersection of the main portion and the wall portion includes a rounded corner.

20. The semiconductor package of claim 19, wherein the rounded corner has a curvature ranging from 1.3 to 1.8 radians per second.

21. A semiconductor package, comprising:
a semiconductor die having a device side;
a conductive pillar coupled to the device side, the conductive pillar including a main portion having a first side facing toward the device side and a wall portion on a second side of the main portion opposite the first side, wherein the wall portion circumscribes a center portion of the second side creating a cavity on the second side; and
a solder member at least partially filling the cavity;
wherein:
the main portion has a first material; and
the wall portion has a second material different than the first material.

22. A semiconductor package, comprising:
a semiconductor die having a device side;
a conductive pillar coupled to the device side, the conductive pillar including a main portion having a first side facing toward the device side and a wall portion on a second side of the main portion opposite the first side, wherein the wall portion circumscribes a center portion of the second side creating a cavity on the second side; and
a solder member at least partially filling the cavity;
wherein grain boundaries of the main portion and the wall portion are mismatched at an interface between the main portion and the wall portion.

* * * * *